US012703059B2

(12) United States Patent
Ueno

(10) Patent No.: US 12,703,059 B2
(45) Date of Patent: Aug. 11, 2026

(54) POLISHING PAD, DOUBLE-SIDE POLISHING DEVICE, AND DOUBLE-SIDE POLISHING METHOD FOR WAFER

(71) Applicant: SHIN-ETSU HANDOTAI CO., LTD., Tokyo (JP)

(72) Inventor: Junichi Ueno, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 474 days.

(21) Appl. No.: 18/035,339

(22) PCT Filed: Oct. 5, 2021

(86) PCT No.: PCT/JP2021/036752
§ 371 (c)(1),
(2) Date: May 4, 2023

(87) PCT Pub. No.: WO2022/107468
PCT Pub. Date: May 27, 2022

(65) Prior Publication Data

US 2024/0009799 A1 Jan. 11, 2024

(30) Foreign Application Priority Data

Nov. 17, 2020 (JP) ................................ 2020-190714

(51) Int. Cl.
*B24B 37/22* (2012.01)
*B24B 37/00* (2012.01)
(Continued)

(52) U.S. Cl.
CPC .............. *B24B 37/22* (2013.01); *B24B 37/00* (2013.01); *B24B 37/08* (2013.01); *B24D 11/00* (2013.01);
(Continued)

(58) Field of Classification Search
None
See application file for complete search history.

(56) References Cited

U.S. PATENT DOCUMENTS

2007/0158308 A1* 7/2007 Koyata .................. B24B 37/04 438/692
2014/0037947 A1* 2/2014 Kazuno ................. C09J 167/02 428/349
(Continued)

FOREIGN PATENT DOCUMENTS

CN 103889655 A 6/2014
CN 107151535 A 9/2017
(Continued)

OTHER PUBLICATIONS

International Preliminary Report on Patentability issued in PCT/JP2021/036752, mailed Jun. 1, 2023.
(Continued)

*Primary Examiner* — Jiong-Ping Lu
(74) *Attorney, Agent, or Firm* — Harness, Dickey & Pierce, P.L.C.

(57) ABSTRACT

The present invention is a polishing pad having a polishing layer for polishing surface of a wafer and a double-sided tape for attaching the polishing layer to an upper turn table of a double-side polishing apparatus, wherein, the double-sided tape has a 90° peeling adhesive strength A of 2000 g/cm or more, and a ratio A/B of the 90° peeling adhesive strength A to a 180° peeling adhesive strength B of 1.05 or more, the double-sided tape has a base material, a polishing-layer-side adhesive layer to be attached to the polishing layer, and an upper-turn-table-side adhesive layer to be attached to the upper turn table, and total thickness of the polishing-layer-side adhesive layer and the upper-turn-table-side adhesive layer is 80 μm or less. This provides a
(Continued)

polishing pad capable of suppressing deterioration of flatness of the wafer when performing double-side polishing of the wafer.

5 Claims, 4 Drawing Sheets

(51) Int. Cl.

| | |
|---|---|
| ***B24B 37/08*** | (2012.01) |
| ***B24D 11/00*** | (2006.01) |
| ***H10P 52/40*** | (2026.01) |
| ***H10P 72/00*** | (2026.01) |
| *H10P 90/00* | (2026.01) |

(52) U.S. Cl.

CPC ........ *H10P 52/402* (2026.01); *H10P 72/0428* (2026.01); *H10P 90/129* (2026.01)

(56) References Cited

U.S. PATENT DOCUMENTS

| | | | |
|---|---|---|---|
| 2014/0256227 | A1 | 9/2014 | Aoki et al. |
| 2017/0253773 | A1 | 9/2017 | Furuta et al. |

FOREIGN PATENT DOCUMENTS

| | | | | |
|---|---|---|---|---|
| CN | 108570295 | * | 9/2018 | ................ C09J 7/29 |
| CN | 108570295 | A | 9/2018 | |
| JP | H11-503191 | A | 3/1999 | |
| JP | 2004-1160 | A | 1/2004 | |
| JP | 2004-323679 | A | 11/2004 | |
| JP | 2005-34940 | A | 2/2005 | |
| JP | 2007-021604 | A | 2/2007 | |
| JP | 2007021604 | * | 2/2007 | ............. B24B 37/20 |
| JP | 2010-150494 | A | 7/2010 | |
| JP | 2011-122069 | A | 6/2011 | |
| JP | 2015-38174 | A | 2/2015 | |
| JP | 2015-78348 | A | 4/2015 | |
| JP | 2018-107261 | A | 7/2018 | |

OTHER PUBLICATIONS

International Search Report and Written Opinion of the ISA issued in PCT/JP2021/036752, mailed Dec. 21, 2021; ISA/JP.

Chinese Office Action in application No. 202180072301.3 issued on Jul. 24, 2025.

Taiwanese Office Action in application No. 110137867 issued on Jun. 19, 2025.

Korean Office Action in application No. 2023-7014099 issued on Mar. 25, 2025.

Chinese Office Action in application No. 202180072301.3 issued on Dec. 5, 2025.

GB/T2792-2014 "Measurement of peel adhesion properties for adhesive tapes", 2014.

Chinese Decision of Refusal in application No. 202180072301.3 issued on Apr. 3, 2026.

* cited by examiner

[FIG. 1]
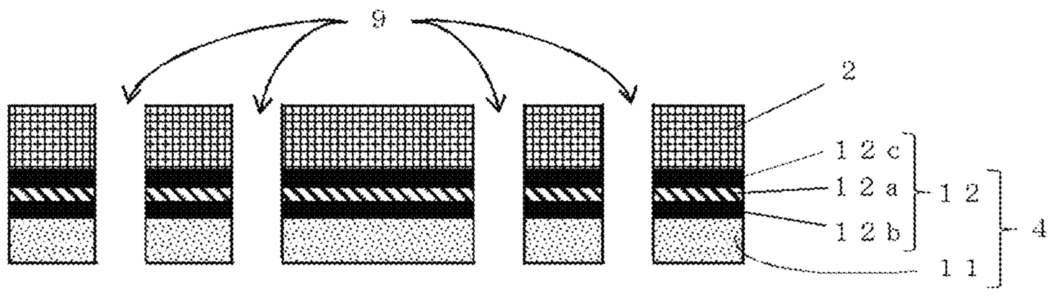
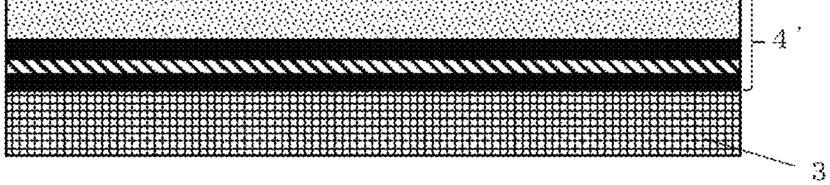
[FIG. 2]
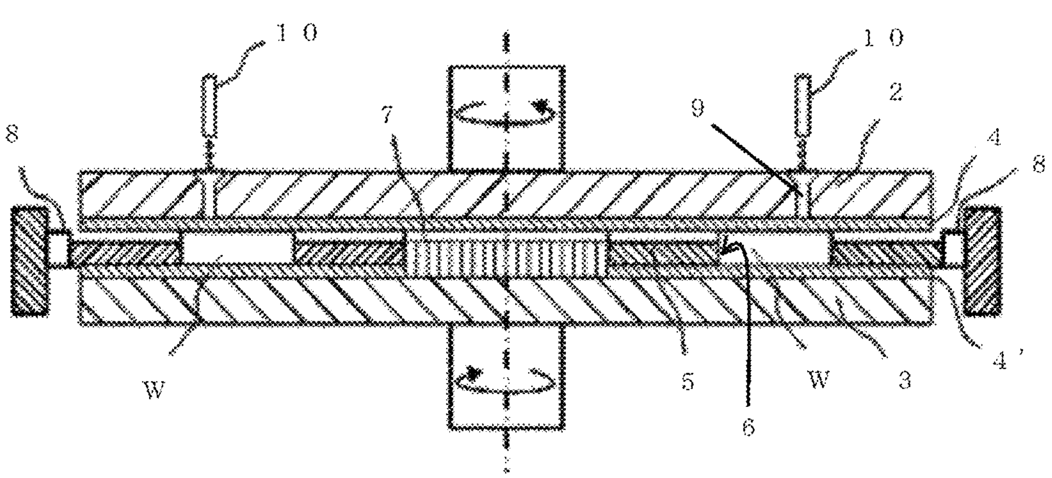
[FIG. 3]
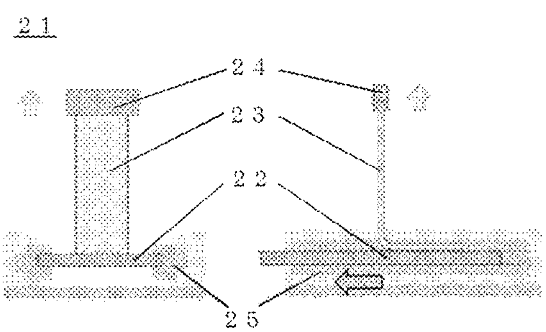

[FIG. 4]
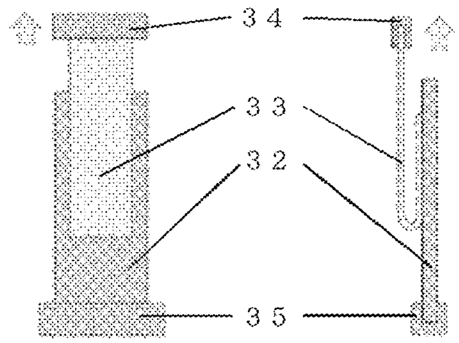
[FIG. 5]
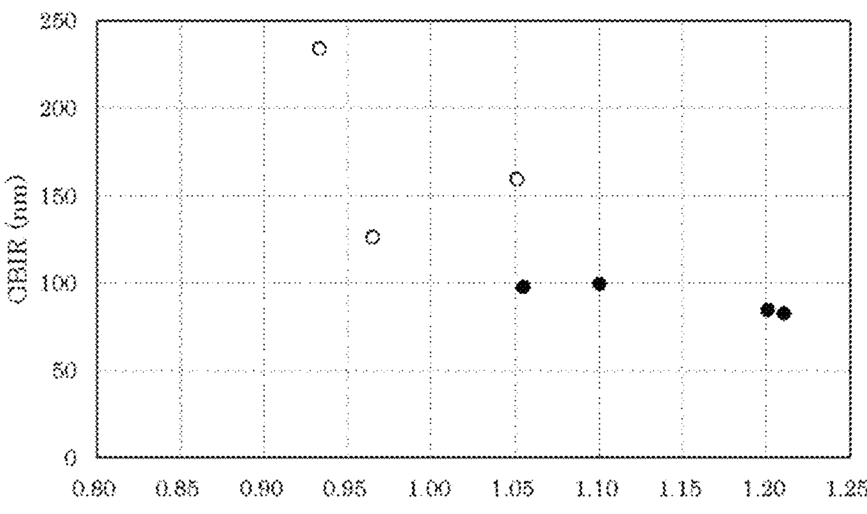

[FIG. 6]
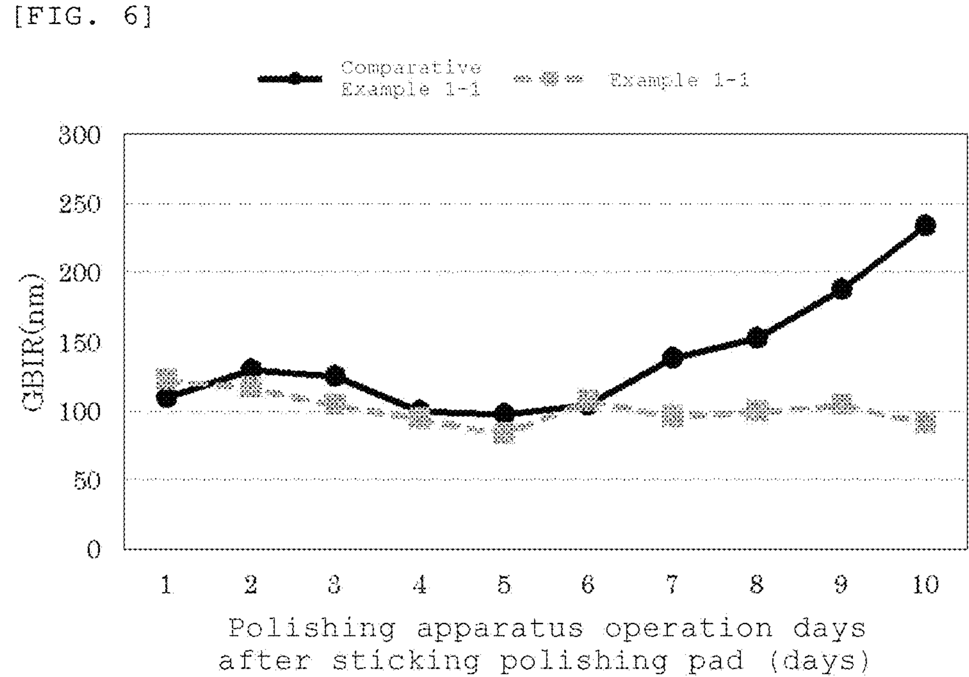
[FIG. 7]
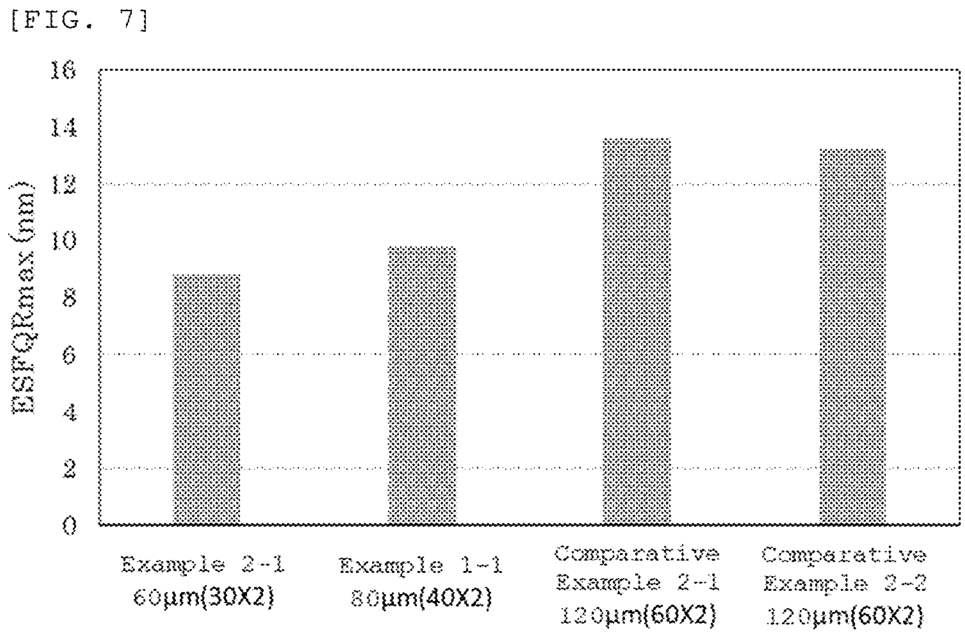

[FIG. 8]
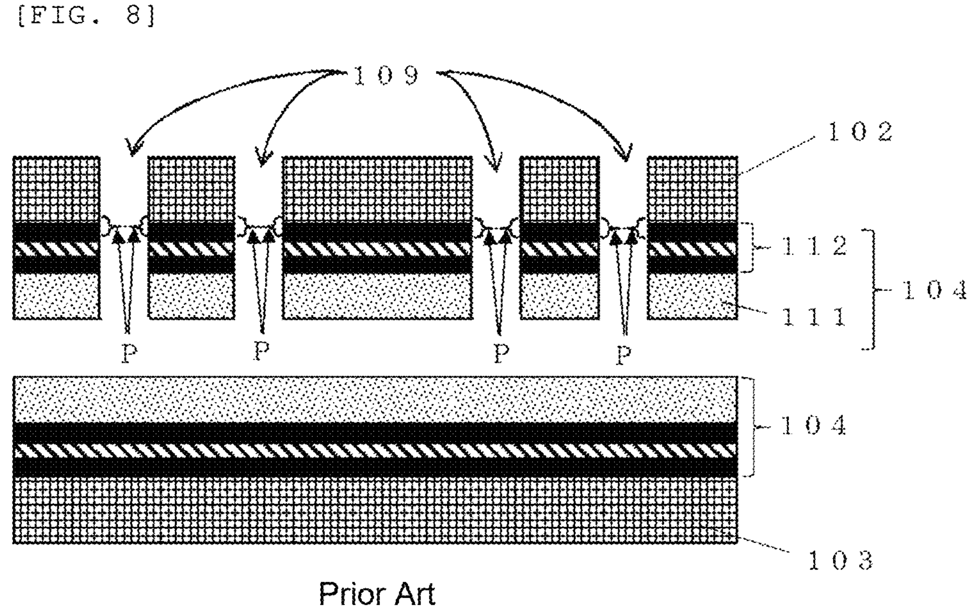
Prior Art

POLISHING PAD, DOUBLE-SIDE POLISHING DEVICE, AND DOUBLE-SIDE POLISHING METHOD FOR WAFER

CROSS-REFERENCE TO RELATED APPLICATIONS

This application is a 371 U.S. National Phase of International Application No. PCT/JP2021/036752, filed on Oct. 5, 2021, which claims priority to Japanese Patent Application No. 2020-190714, filed Nov. 17, 2020. The entire disclosures of the above applications are incorporated herein by reference.

TECHNICAL FIELD

The present invention relates to a polishing pad, a double-side polishing apparatus, and a double-side polishing method for a wafer.

BACKGROUND ART

A polishing pad used in a double-side polishing apparatus has a polishing layer for polishing surface of a wafer and a double-sided tape for attaching to a turn table, and is attached to an upper turn table and a lower turn table. The upper turn table has slurry supply ports for supplying polishing slurry to a polishing process part of the wafer and the polishing pad of the upper turn table side is attached to the upper turn table with the double-sided tape, while it is bored at positions of the slurry supply ports.

However, the double-sided tape where the polishing pad on the upper turn table side is bored has reduced adhesive strength due to being permeated with the polishing slurry from the side surface, and furthermore, gravity is exerting a force in the direction of peeling off vertically from the upper turn table, polishing pad peeling may occur. FIG. 8 shows locations where such peeling of the polishing pad occurs. A polishing pad 104 is attached to each of the upper and lower turn tables 102 and 103, and the polishing pad 104 on the upper turn table side is bored at positions of a slurry supply ports 109 for supplying polishing slurry. The polishing pad 104 has a polishing layer 111 for polishing the surface of the wafer and a double-sided tape 112 for attaching the polishing layer 111 to the turn table.

A polishing pad peeling portions P are side surfaces inside the slurry supply ports 109 and are bonding surfaces between the upper turn table 102 and the polishing pad 104. When the polishing slurry permeates into these portions, it leads to the aforementioned peeling of the polishing pad.

This peeling of the polishing pad leads to deterioration of the shape (flatness) of the wafer to be polished. On the other hand, the polishing pad 104 on the lower turn table has no bore and is not subjected to a force in the direction of vertical peeling off from the lower turn table 103, so that the polishing pad 104 on the lower turn table 103 is less likely to be peeled off than the one on the upper turn table 102.

In order to prevent the polishing pad on the upper turn table side from peeling off due to such polishing slurry, for example, a double-sided tape using an adhesive having excellent acid and alkali resistance is used (for example, Patent Document 1).

CITATION LIST

Patent Literature

Patent Document 1: JP 2010-150494 A

SUMMARY OF INVENTION

Technical Problem

By the way, the definition of the adhesive strength of the double-sided tape used in the conventional polishing pad is the definition of 180° peeling adhesive strength against the peeling off in the direction along the surface of the turn table, and 90° peeling adhesive strength against the peeling off perpendicular to the turn table has not been considered. Therefore, the inventor of the present invention measured the 90° peeling adhesive strength and 180° peeling adhesive strength of the conventional double-sided tape, and confirmed the ratio (90° peeling adhesive strength/180° peeling adhesive strength) to be about 0.93, the 180° peeling adhesive strength was stronger than the 90° peeling adhesive strength. The structure of the double-sided tape used comprises a PET with a thickness of 25 μm as a base material at the center, the adhesive layer on the side of the polishing layer attached to the polishing layer having a thickness of 40 μm, and the adhesive layer on the side of upper turn table attached to the upper turn table having a thickness of 40 μm.

When wafers were polished with the polishing pad using the double-sided tape as described above, the global shape of flatness of the polished wafers sometimes deteriorates over time. When the polishing pad was replaced at this time, the flatness returned to its original level. Since peeling near the supply ports of the polishing pad on the upper turn table side was confirmed at the time of the replacement of the polishing pads, insufficient adhesive strength of the polishing pad was observed on the upper turn table side. Since the polishing pad on the lower turn table side was not found to have insufficient adhesive strength, it was thought that a stronger 90° peeling adhesive strength was necessary, taking into consideration the weight of the polishing pad of the polishing pad size.

In addition, increasing the thickness of the adhesive layer of the double-sided tape also increases the adhesive strength to the turn table, but if the adhesive layer is thick when the wafer is pressed against the polishing pad, creep deformation of the adhesive layer occurs. This leads to deterioration of the flatness (especially edge flatness) of the polished wafer.

The present invention has been made to solve such problems, and an object of the present invention is to provide a polishing pad capable of preventing the peeling of the polishing pad over time, suppressing the creep deformation of the adhesive layer, and suppressing deterioration of the flatness of the wafer during double-side polishing.

Solution to Problem

In order to solve the above problems, the present invention provides a polishing pad having a polishing layer for polishing surface of a wafer and a double-sided tape for attaching the polishing layer to an upper turn table of a double-side polishing apparatus, wherein, the double-sided tape has a 90° peeling adhesive strength A of 2000 g/cm or more, and a ratio A/B of the 90° peeling adhesive strength A to a 180° peeling adhesive strength B of 1.05 or more, the double-sided tape has a base material, a polishing-layer-side adhesive layer to be attached to the polishing layer, and an upper-turn-table-side adhesive layer to be attached to the upper turn table, and total thickness of the polishing-layer-side adhesive layer and the upper-turn-table-side adhesive layer is 80 μm or less.

With such a polishing pad, the 90° peeling adhesive strength A of the double-sided tape is sufficiently strong, and peeling due to gravity can be prevented. Furthermore, since the thickness of the adhesive layer is not too thick, creep deformation of the adhesive layer during polishing can be suppressed. As a result, it is possible to suppress the deterioration of the flatness of the polished wafer (in particular, both GBIR and ESFQRmax).

Further, the double-sided tape has the polishing-layer-side adhesive layer with a thickness of 40 μm or less and the upper-turn-table-side adhesive layer with a thickness of 40 μm or less.

With such a structure, since the thickness of each adhesive layer is not too thick, the creep deformation of the adhesive layer can be suppressed more reliably.

Further, the present invention provides a double-side polishing apparatus comprising, polishing pads, rotatable upper and lower turn tables to which the polishing pads are respectively attached, a carrier having a holding hole for holding a wafer between the upper and lower turn tables, and a slurry supply port for supplying polishing slurry to the wafer held by the carrier, wherein the polishing pad attached to the upper turn table is the polishing pad described above.

With such a double-side polishing apparatus, it is possible to prevent the polishing pad from peeling off over time during double-side polishing, and to suppress the creep deformation of the adhesive layer, thereby suppressing deterioration of the flatness of the polished wafer.

Further, the present invention provides a double-side polishing method for a wafer, including: holding a wafer in a carrier of a double-side polishing apparatus; interposing the held wafer between an upper turn table and a lower turn table each having a polishing pad attached thereto; and supplying polishing slurry from a polishing slurry supply port while rotating the upper and lower turn tables to simultaneously polish both surfaces of the wafer, wherein the double-side polishing apparatus described above is used as the double-side polishing apparatus.

With such a double-side polishing method for a wafer, it becomes a double-side polishing method that can suppress the deterioration of the flatness of the polished wafer.

Advantageous Effects of Invention

As described above, according to the polishing pad, the double-side polishing apparatus and the double-side polishing method of the present invention, it is possible to prevent peeling of the polishing pad and suppress creep deformation of the adhesive layer of the double-sided tape when performing double-side polishing of the wafer. It is possible to suppress the deterioration of the flatness of the polished wafer.

BRIEF DESCRIPTION OF DRAWINGS

FIG. 1 is a schematic diagram showing a structure of a polishing pad of the present invention attached to an upper turn table.

FIG. 2 is a schematic diagram showing an example of the double-side polishing apparatus of the present invention having the polishing pad of the present invention on an upper turn table.

FIG. 3 is an explanatory view showing an example of a measuring device for 90° peeling adhesive strength.

FIG. 4 is an explanatory view showing an example of a measuring device for 180° peeling adhesive strength.

FIG. 5 is a graph showing measurement results of GBIR of Examples 1-1 to 1-4 and Comparative Examples 1-1 to 1-3.

FIG. 6 is a graph showing changes in GBIR over days in Example 1-1 and Comparative Example 1-1.

FIG. 7 is a graph showing the measurement results of ESFQRmax in Examples 1-1 and 2-1 and Comparative Examples 2-1 and 2-2.

FIG. 8 is an explanatory diagram showing peeled portions of a conventional polishing pad attached to an upper turn table.

DESCRIPTION OF EMBODIMENTS

Hereinafter, the present invention will be described in detail as an example of embodiments with reference to the drawings, but the present invention is not limited thereto.

FIG. 2 shows an example of the double-side polishing apparatus of the present invention having a polishing pad of the present invention, which will be described later, on the upper turn table. Components, their mechanisms, and their roles are described. As shown in FIG. 2, the double-side polishing apparatus 1 has a cylindrical upper turn table 2 and a cylindrical lower turn table 3. The polishing pad 4 of the present invention is attached on the upper turn table 2 and the polishing pad 4' is attached on the lower turn table 3 so that their polishing surfaces face each other. The polishing pad 4' on the lower turn table side is not particularly limited. For example, the same polishing pad as the polishing pad 4 of the present invention can be used, or a conventional polishing pad can be used. A sun gear 7 is attached to the inner side of the lower turn table 3, and an internal gear 8 is attached to the outer side. The upper and lower turn tables 2 and 3, the sun gear 7, and the internal gear 8 have the same central axis of rotation, and can rotate independently about the axis.

Carriers 5 are provided with holding holes 6 for holding wafers W, and a plurality of carriers 5 are interposed between upper and lower turn tables 2 and 3. A single carrier 5 is provided with a plurality of holding holes 6 so that a plurality of wafers W can be polished for each batch. Further, the carrier 5 meshes with the sun gear 7 and the internal gear 8 respectively, and rotates and revolves between the upper and lower turn tables according to the rotational speeds of the sun gear 7 and the internal gear 8. The wafer W is inserted and held in the holding hole 6 of the carrier 5, and the upper turn table 2 descends to interpose the wafer W and the carrier 5 and apply a polishing load. Then, the upper turn table 2 and the lower turn table 3 are rotated in opposite directions while the polishing slurry supplied from the nozzles 10 are poured between the upper and lower turn tables through the slurry supply ports 9 provided in the upper turn table 2. Thereby, both sides of the wafers W are polished at the same time.

The polishing pad of the present invention will now be described in detail. FIG. 1 is a schematic diagram showing the structure of the polishing pad of the present invention attached to an upper turn table. The polishing pad 4' on the lower turn table side is also shown. The polishing pad 4 on the upper turn table side is bored at positions of the slurry supply ports 9 for supplying the polishing slurry. The polishing pad 4 has a polishing layer 11 for polishing the surface of the wafer W and a double-sided tape 12 for attaching the polishing layer 11 to the upper turn table 2. The double-sided tape 12 is composed of a base material 12*a*, a polishing-layer-side adhesive layer 12*b* to be attached to the polishing layer 11, and an upper-turn-table-side adhesive layer 12*c* to be attached to the upper turn table 2.

Here, the double-sided tape 12 has a 90° peeling adhesive strength A of 2000 g/cm or more, and a ratio A/B (hereinafter also referred to as aspect ratio) of the 90° peeling adhesive strength A to a 180° peeling adhesive strength B is 1.05 or more. With such a structure, even if the polishing slurry permeates from the slurry supply ports 9 and the adhesive strength is lowered, and the force of peeling off the polishing pad 4 in the vertical direction from the upper turn table 2 is applied by gravity, the 90° peeling adhesive strength A is sufficiently strong, peeling of the polishing pad 4 can be therefore prevented. This makes it possible to suppress the deterioration of the GBIR of the polished wafer.

It should be noted that the larger the 90° peeling adhesive strength A is, the more effective it is in preventing the polishing pad 4 from peeling off, which is preferable, so the upper limit cannot be determined. Therefore, the upper limit of the aspect ratio cannot be determined either.

Method for measuring the 90° peeling adhesive strength A and the 180° peeling adhesive strength B is not particularly limited, but, for example, according to JIS Z0237: 2009, which is a method for measuring the peeling strength of adhesive tapes, it can be performed as follows.

FIG. 3 shows an example of a 90° peeling adhesive strength measuring device, and FIG. 4 shows an example of a 180° peeling adhesive strength measuring device. The left figure shows a front view, and the right figure shows a side view in each of them. In the 90° peeling adhesive strength measuring device 21, one end of a test piece 23 attached to a test plate 22 is held by a upper chuck 24 and peeled off in the 90° direction. At this time, the test plate 22 moves horizontally along a slide guide 25 in accordance with the peeling motion, so that the peeling direction can be maintained at 90°.

On the other hand, in the 180° peeling adhesive strength measuring device 31, one end of a test piece 33 attached to a test plate 32 is held by an upper chuck 34 and peeled off in the 180° direction. At this time, the test plate 32 is fixed to a lower chuck 35.

As test methods, for example, PET-lined test pieces 23 and 33 having a width of 100 mm and a length of 250 mm are crimped to test plates 22 and 32 made of SUS by reciprocating with a 2 kg rubber roller, and kept at a temperature of 20° C. and the humidity of 65% for 20 minutes. After that, one ends of the test pieces 23, 33 are held by the upper chucks 24, 34, and peeled off at a speed of 300 mm/min in 90° and 180° directions.

That is, in the measurement of the 90° peeling adhesive strength, one end of the test piece 23 is folded back by 90° and pulled perpendicularly to the test plate 22 at a speed of 300 mm/min. Along with the pulling, the test plate 22 also slides horizontally at the same speed.

On the other hand, in the measurement of the 180° peeling adhesive strength, one end of the test piece 33 is folded back by 180° and pulled at a speed of 300 mm/min so as to be turned in the direction along the test plate 32. The test plate 32 is fixed so as not to move.

In this way, the 90° and 180° peeling adhesive strength can be measured.

The double-sided tape 12 has a total thickness of the polishing-layer-side adhesive layer 12*b* and the upper-turn-table-side adhesive layer 12*c* being 80 μm or less. If the thickness of the adhesive layer is not too thick, creep deformation of the adhesive layer during polishing can be prevented, and deterioration of flatness (especially edge flatness) of the polished wafer W can be suppressed.

The thickness of each of the polishing-layer-side adhesive layer 12*b* and the upper-turn-table-side adhesive layer 12*c* is not particularly limited as long as the total thickness is 80 μm or less. For example, the thickness of the polishing-layer-side adhesive layer 12*b* can be set to 40 μm or less. Moreover, the thickness of the upper-turn-table-side adhesive layer 12*c* can be set to 40 μm or less. In this way, if the thickness of each adhesive layer is not too thick, creep deformation can be suppressed more reliably.

The lower limit of the total thickness of the polishing-layer-side adhesive layer 12*b* and the upper-turn-table-side adhesive layer 12*c* and the lower limit of the thickness of each adhesive layer are not particularly limited, and can be, for example, greater than zero.

Although the thickness and material of the base material 12*a* are not particularly limited, for example, it can be a PET sheet with a thickness of 25 μm.

The adhesive used for the adhesive layer of the double-sided tape 12 is not particularly limited, but for example, rubber-based (natural rubber, synthetic rubber), acrylic, vinyl-ether, urethane-based, and fluorine-based adhesives can be used. In the case of natural rubber type, it can be composed of natural rubber, synthetic rubber, tackifying resin, and softening agent. The 90° peeling adhesive strength A and the 180° peeling adhesive strength B can be adjusted by changing weight part ratio of natural rubber to rubber weight part. In the case of acrylic type, it can be composed of an acrylic ester copolymer, a cross-linking agent, and a tackifying resin. The 90° peeling adhesive strength A and the 180° peeling adhesive strength B can be adjusted by changing the weight part ratio of the tackifying resin (rosin) to the acrylic copolymer weight part.

By using the polishing pad of the present invention as described above for the polishing pad on the upper turn table side of the double-side polishing apparatus as shown in FIG. 2, it is possible to prevent the polishing pad from peeling off over time during double-side polishing, and to suppress the creep deformation of the adhesive layer, thereby suppressing deterioration of the flatness of the polished wafer.

A method of polishing both sides of a wafer according to the present invention using the double-side polishing apparatus of the present invention will be described below.

A double-side polishing apparatus 1 as shown in FIG. 2 in which a polishing pad 4 according to the present invention is attached on an upper turn table is prepared. A polishing pad 4' on a lower turn table side is not particularly limited, and is the same as the conventional one. A wafer W held in a holding hole 6 of a carrier 5 is interposed between upper and lower turn tables 2 and 3, and polishing slurry is supplied from slurry supply ports 9 while rotating the upper and lower turn tables 2 and 3 in mutually opposite directions to polish both sides of the wafer W at the same time.

At this time, the polishing slurry permeates into a double-sided tape 12 of the polishing pad 4 on the upper turn table side over time from the slurry supply ports 9. Peeling of the polishing pad 4 can be prevented since a 90° peeling adhesive strength of the double-sided tape 12 is sufficiently strong. Also, since the total thickness of the polishing-layer-side adhesive layer 12*b* and the upper-turn-table-side adhesive layer 12*c* is not too thick, creep deformation of the adhesive layer can be suppressed. As a result, deterioration of the flatness of the polished wafer can be suppressed.

EXAMPLE

The present invention will be described in more detail below with reference to Examples, but the present invention is not limited to these.

Examples 1-1 to 1-4

Polishing pads were produced in which the aspect ratio of the adhesive strength was changed by changing the adhesive by setting double-sided tape made by laminating a PET sheet with a thickness of 25 μm with a polishing-layer-side adhesive layer and an upper-turn-table-side adhesive layer each with a thickness of 40 μm (total thickness of 80 μm), while setting a structure (a thickness) of the polishing layer and a double-sided tape as same. The aspect ratio of the adhesive strength was calculated by performing a 180° peeling test and a 90° peeling test by above described method according to JIS Z0237: 2009 using the apparatus shown in FIGS. 3 and 4.

Specifically, using an acrylic adhesive, the ratio of the weight part of the tackifying resin (rosin) to the weight part of the acrylic copolymer was changed as 15 parts by weight in Example 1-1, 12 parts by weight in Example 1-2, 10 parts by weight in Example 1-3 and 9 parts by weight in Example 1-4. As a result, the aspect ratios of Examples 1-1 to 1-4 were 1.054, 1.100, 1.200 and 1.210 respectively. In addition, the 90° peeling adhesive strength was 2000 g/cm or more.

A double-side polishing apparatus in which the prepared polishing pad was attached to an upper turn table was used to perform double-side polishing of the wafer for 10 days. After processing on the 10th day, GBIR, which is the global flatness of the wafer, was measured using WaferSight2 manufactured by KLA Corporation. Polishing process conditions and quality evaluation conditions were as follows.

(Polishing Process Conditions)

Equipment: Double-side polishing apparatus manufactured by Fujikoshi Machinery Corp.

Processing wafer: Diameter 300 mm Si $P^-$ product <100>

Polishing layer: Urethane foam type

Double-sided tape: 40 μm thick adhesive layer on the polishing layer side, 40 μm thick adhesive layer on the upper turn table side, Thickness of base material (PET sheet) 25 μm Polishing slurry: KOH-based colloidal silica (quality evaluation conditions)

Equipment: WaferSight2 flatness measuring equipment manufactured by KLA Corporation Conditions; Edge Exclusion=2 mm ESFQR: L 30 mm 72 Sites (5° intervals)

Comparative Examples 1-1 to 1-3

In the double-sided tape of the polishing pad, the same natural rubber-based adhesive as the conventional one was used, and the ratio of the weight part of the natural rubber to the weight part of the rubber was changed, 30 parts by weight in Comparative Example 1-1, 50 parts by weight in Comparative Example 1-2 and 35 parts by weight in Comparative Example 1-3. As a result, the aspect ratios of Comparative Examples 1-1 to 1-3 were 0.933, 0.964 and 1.050, respectively. Comparative Examples 1-1 and 1-3 had a 90° peeling adhesive strength of less than 2000 g/cm, and Comparative Example 1-2 had a 90° peeling adhesive strength of 2000 g/cm or more. Then, the wafers were polished on both sides under the same conditions as in Example 1-1, and the GBIR of the wafers were measured.

Table 1 and FIG. 5 show the measurement results of Examples 1-1 to 1-4 and Comparative Examples 1-1 to 1-3. In FIG. 5, examples are indicated by ●, and comparative examples are indicated by ○.

The relationship between the conditions of the double-sided tape of the polishing pad on the upper turn table side and the GBIR of the polished wafer will be considered below.

TABLE 1

| | 90° peeling adhesive strength A [g/cm] | 180° peeling adhesive strength B [g/cm] | Aspect ratio (A/B) | GBIR [nm] |
|---|---|---|---|---|
| Example 1-1 | 2224 | 2110 | 1.054 | 98.5 |
| Example 1-2 | 2122 | 1929 | 1.100 | 100 |
| Example 1-3 | 2051 | 1709 | 1.200 | 85 |
| Example 1-4 | 2000 | 1653 | 1.210 | 83 |
| Comparative Example 1-1 | 1701 | 1824 | 0.933 | 234.7 |
| Comparative Example 1-2 | 2363 | 2451 | 0.964 | 127 |
| Comparative Example 1-3 | 1931 | 1839 | 1.050 | 160 |

As shown in Table 1 and FIG. 5, a polished wafer having a GBIR of about 100 nm or less can be obtained by processing with a polishing pad of which the 90° peeling adhesive strength A is 2000 g/cm or more, and of which the aspect ratio A/B of the adhesive strength is 1.05 or more (90° peeling adhesive strength is sufficiently stronger than 180° peeling adhesive strength). That is, it can be seen that the GBIR quality becomes flat. On the other hand, when the 90° peeling adhesive strength A is less than 2000 g/cm or the aspect ratio A/B of the adhesive strength is less than 1.05, the GBIR quality deteriorates.

In addition, the total thickness of the adhesive layer is 80 μm as described above. In Examples 1-1 to 1-4, as a result of measuring ESFQRmax, which is the edge flatness of the wafer, all the examples had good values of less than 10 nm.

In addition, in order to confirm the transition of GBIR, the GBIR of Example 1-1 and Comparative Example 1-1 were measured every day. The measurement results are shown in FIG. 6. In Comparative Example 1-1, the GBIR gradually deteriorated from the 7th day, whereas in Example 1-1, the GBIR remained stable without deterioration as the days passed. Since the GBIR was stable in this way, it can be confirmed that the polishing pad was not peeled off.

Example 2-1

In the double-sided tape of the polishing pad, an acrylic adhesive was used in the same manner as in Example 1-1, and the weight ratio of the weight part of the tackifying resin (rosin) to the weight part of the acrylic copolymer was set to 15 parts by weight. Also, the thickness of the polishing-layer-side adhesive layer and the upper-turn-table-side adhesive layer was set to 30 μm (60 μm in total). The 90° peeling adhesive strength A of this double-sided tape was 2048 g/cm, and the 180° peeling adhesive strength B was 1932 g/cm (aspect ratio 1.060). Then, the wafers were polished on both sides under the same conditions as in Example 1-1, and the GBIR of the wafer and ESFQRmax, which is edge flatness, were measured.

Comparative Examples 2-1 to 2-2

The thickness of the polishing-layer-side adhesive layer and the upper-turn-table-side adhesive layer of the double-sided tape was set to 60 μm each (120 μm in total). The aspect ratio of Comparative Example 2-1 was 1.020, and the aspect ratio of Comparative Example 2-2 was 1.051. Specifically, using an acrylic adhesive, the ratio of the weight part of the tackifying resin (rosin) to the weight part of the acrylic copolymer was 15 parts by weight in Comparative Example 2-1 and 9 parts by weight in Comparative Example 2-2. Then, the wafers were polished on both sides under the same conditions as in Example 1-1, and the GBIR of the wafer and ESFQRmax, which was edge flatness, were measured.

Table 2 and FIG. 7 show the measurement results of Example 2-1 and Comparative Examples 2-1 and 2-2. In addition, the data of Example 1-1 are also shown.

TABLE 2

| | Adhesive layer thickness [μm] | 90° peeling adhesive strength A [g/cm] | 180° peeling adhesive strength B [g/cm] | Aspect ratio (A/B) | GBIR [nm] | ESFQRmax [nm] |
|---|---|---|---|---|---|---|
| Example 1-1 | 80 (40 × 2) | 2224 | 2110 | 1.054 | 98.5 | 9.8 |
| Example 2-1 | 60 (30 × 2) | 2048 | 1932 | 1.060 | 101.3 | 8.8 |
| Comparative Example 2-1 | 120 (60 × 2) | 2280 | 2235 | 1.020 | 126.7 | 13.6 |
| Comparative Example 2-2 | 120 (60 × 2) | 2006 | 1908 | 1.051 | 103.4 | 13.2 |

As shown in Table 2 and FIG. 7, processing is performed with a polishing pad using double-sided tape in which the total thickness of the polishing-layer-side adhesive layer and the upper-turn-table-side adhesive layer is 80 μm or less. It can be seen that quality of the ESFQRmax, which is edge flatness, is flat. Comparative Example 2-2 had a 90° peeling adhesive strength A of 2000 g/cm or more and an aspect ratio of 1.05 or more, resulting in a good GBIR value but a worse ESFQRmax.

As described above, with the polishing pad, the double-side polishing apparatus, and the double-side polishing method of the present invention, the polishing pad on the upper turn table side can be prevented from peeling off, and the creep deformation of the adhesive layer can be suppressed. Deterioration of wafer flatness (both GBIR and ESFQRmax) can be suppressed.

The present invention is not limited to the above embodiments. The above-described embodiments are just examples, and any examples that substantially have the same configuration and demonstrate the same functions and effects as those in the technical concept disclosed in the claims of the present invention are included in the technical scope of the present invention.

The invention claimed is:

1. A polishing pad having a polishing layer for polishing surface of a wafer and a double-sided tape for attaching the polishing layer to an upper turn table of a double-side polishing apparatus, wherein, the double-sided tape has a 90° peeling adhesive strength A of 2000 g/cm or more, and a ratio A/B of the 90° peeling adhesive strength A to a 180° peeling adhesive strength B of 1.05 or more, the double-sided tape has a base material, a polishing-layer-side adhesive layer to be attached to the polishing layer, and an upper-turn-table-side adhesive layer to be attached to the upper turn table, and total thickness of the polishing-layer-side adhesive layer and the upper-turn-table-side adhesive layer is 80 μm or less.

2. The polishing pad according to claim 1, wherein the double-sided tape has the polishing-layer-side adhesive layer with a thickness of 40 μm or less and the upper-turn-table-side adhesive layer with a thickness of 40 μm or less.

3. A double-side polishing apparatus comprising, polishing pads, rotatable upper and lower turn tables to which the polishing pads are respectively attached, a carrier having a holding hole for holding a wafer between the upper and lower turn tables, and a slurry supply port for supplying polishing slurry to the wafer held by the carrier, wherein the polishing pad attached to the upper turn table is the polishing pad according to claim 1.

4. A double-side polishing apparatus comprising, polishing pads, rotatable upper and lower turn tables to which the polishing pads are respectively attached, a carrier having a holding hole for holding a wafer between the upper and lower turn tables, and a slurry supply port for supplying polishing slurry to the wafer held by the carrier, wherein the polishing pad attached to the upper turn table is the polishing pad according to claim 2.

5. A double-side polishing method for a wafer, including: holding a wafer in a carrier of a double-side polishing apparatus; interposing the held wafer between an upper turn table and a lower turn table each having a polishing pad according to claim 1 attached thereto; and supplying polishing slurry from a polishing slurry supply port while rotating the upper and lower turn tables to simultaneously polish both surfaces of the wafer.

* * * * *